(12) United States Patent
Wu et al.

(10) Patent No.: US 7,332,962 B2
(45) Date of Patent: Feb. 19, 2008

(54) FILTERLESS CLASS D POWER AMPLIFIER

(75) Inventors: Kuo-Hung Wu, Tainan County (TW);
Kwang-Hwa Liu, Sunnyvale, CA (US);
Cheng-Nan Wu, Tainan County (TW);
Tyng-Yang Chen, Tainan County (TW)

(73) Assignee: Amazion Electronics, Inc., Tainan County (TW)

( * ) Notice: Subject to any disclaimer, the term of this patent is extended or adjusted under 35 U.S.C. 154(b) by 115 days.

(21) Appl. No.: 11/319,845

(22) Filed: Dec. 27, 2005

(65) Prior Publication Data

US 2007/0146069 A1   Jun. 28, 2007

(51) Int. Cl.
*H03F 3/217* (2006.01)
*H03F 3/38* (2006.01)

(52) U.S. Cl. ............... 330/251; 330/10; 330/207 A

(58) Field of Classification Search ............... None
See application file for complete search history.

(56) References Cited

U.S. PATENT DOCUMENTS

| | | | |
|---|---|---|---|
| 5,672,998 A | 9/1997 | Wittlinger | 330/10 |
| 5,805,020 A | 9/1998 | Danz et al. | 330/10 |
| 6,211,728 B1 * | 4/2001 | Chen et al. | 330/10 |
| 6,249,182 B1 | 6/2001 | Pullen | 330/10 |
| 6,262,632 B1 * | 7/2001 | Corsi et al. | 330/251 |
| 6,420,930 B1 | 7/2002 | Takagishi | 330/251 |
| 6,614,297 B2 * | 9/2003 | Score et al. | 330/10 |
| 6,847,257 B2 * | 1/2005 | Edwards et al. | 330/10 |
| 7,190,225 B2 * | 3/2007 | Edwards | 330/251 |
| 2006/0284672 A1 * | 12/2006 | Chang et al. | 330/10 |
| 2006/0284677 A1 * | 12/2006 | Chang et al. | 330/251 |
| 2007/0109049 A1 * | 5/2007 | Wu | 330/251 |

* cited by examiner

*Primary Examiner*—Robert Pascal
*Assistant Examiner*—Krista M Flanagan
(74) *Attorney, Agent, or Firm*—J.C. Patents

(57) ABSTRACT

A double reference wave modulation scheme for filterless power amplifiers is disclosed for reducing EMI and common mode voltages. In the filterless power amplifier, differential outputs for driving load impedance are feedback and corrected based on input audio signals. Reference wave generators generate reference waves. A control logic results pulses in the pair of differential outputs in response to a clock signal or a reference voltage and a cross relationship between the input audio signal and the first and second reference waves. Pulses of one of the differential outputs are not overlapped with pulses of the other of the differential outputs for eliminating common mode noises of the power amplifier.

20 Claims, 15 Drawing Sheets

FILTERLESS CLASS D POWER AMPLIFIER

BACKGROUND OF THE INVENTION

1. Field of Invention

This invention relates generally to filterless amplifiers, and more particularly, to a double reference waves filterless modulation scheme for filterless amplifiers and method thereof to reduce EMI (Electronic-Magnetic Interference) and common mode noise.

2. Description of Related Art

Class-D audio power amplifiers are two to five time more efficient than class-AB audio power amplifiers. Because of their greater efficiency, class-D amplifiers require smaller power supplies and eliminate heat sinks, significantly reducing overall system costs, size and weight.

Class D audio power amplifiers convert audio signals into high-frequency pulses that switch the output in accordance with the audio input signal. Some class D amplifier use pulse width modulators (PWM) for generating a series of conditioning pulses that vary in width with the audio signal's amplitude. The varying-width pulses switch the power-output transistors at a fixed frequency. Other class D amplifiers may rely upon other types of pulse modulators. For heuristic purposes, the following discussion mainly refers to pulse width modulators, but those skilled in the art will recognize that class D amplifiers may be configured with other types of modulators.

FIG. 1 illustrates a Class D amplifier familiar to those skilled in the art. The input audio signal is input into an input amplifier 101 via capacitors CIN1 and CIN2. Then, a comparator 105 compares the amplifier's output at a negative input and the triangular waves, generated from triangular wave generator 103, at a positive input for generating PWM signals. The PWM signals are input into a gate drive 107 for driving transistors Q11~Q14. Differential outputs, OUTP and OUTN, of the class D amplifier are respectively fed into low-pass filters (formed of an inductor L1 and a capacitor C1, and an inductor L2 and a capacitor C2) that convert the pulses back into an amplified audio signal for driving one or more loads 109 (for example, audio speakers).

The traditional class D amplifiers have differential outputs (OUTP and OUTN). Differential outputs are complementary to each other and include a swing range from ground to VDD.

FIGS. 2A~2C illustrate the waveforms when the input signal is large, small and zero, respectively. In FIG. 2C, large output ripple currents are caused. For reducing the large output ripple currents, a large LC filter is needed, as shown in FIG. 1.

When the input signal is zero or very small, the traditional class D amplifier has a differential voltage across load with almost 50% duty cycle. This 50% duty cycle sinks and sources large currents through the load (the speaker), resulting additional power consumption.

Class-D amplifiers are not popular in many portable products because the traditional class-D amplifier requires large LC filter, which increases size and solution cost. Filterless class-D amplifiers eliminate the output filter while keeping the efficiency benefit. The filterless modulation scheme brings class-D amplifiers approximately equal to class-AB amplifiers in cost and size, but still gains the great efficiency advantages. A traditional filterless class D amplifier is shown in FIG. 3. FIGS. 4A and 4B illustrate waveforms of FIG. 3 when the input signal is large and small, respectively.

As shown in FIG. 3, the filterless class D amplifier for driving a load 315 at least includes capacitors CIN3, C31 and C32, resistors RS1~RS4 and RFB31~RFB34, a differential input amplifier 301, two integrators 305 and 307, a triangular wave generator 303, two comparators 309 and 311, a control logic & gate drive 313 and switching transistors Q31~Q34. This modulation scheme reduces EMI and does not have low-pass filters (that is why it is called "filterless"). However, this kind of modulation scheme still has a problem relying on common mode voltage variation, since OUTP and OUTN are high or low at the same time, as shown in FIGS. 4A and 4B. This is equivalent to a large swing of common-mode voltage. The ternary modulation scheme suffers from high common mode switching noises and requires additional filter to suppress the common mode switching noises. The common mode switching noises are more severe when the input signal is small. Besides, this modulation scheme uses two integrators, which increases quiescent currents, circuit size and solution cost.

Therefore, a new and highly efficient class D audio power amplifier is needed to overcome drawbacks in the known art.

SUMMARY OF THE INVENTION

One of the aspects of the invention is to provide a highly efficient filterless class D audio power amplifier.

Another aspect of the invention is to provide a filterless class D audio power amplifier with high audio quality.

Another aspect of the invention is to provide a filterless class D audio power amplifier with low EMI.

Another aspect of the invention is to provide a filterless class D audio power amplifier capable of reducing common mode noises.

To at least achieve the above and other aspects, in one embodiment of the invention, a filterless audio power amplifier for processing an input audio signal is provided. The filterless audio power amplifier outputs differential outputs for driving a load impedance. The filterless audio power amplifier includes: an error amplifier, the input audio signal coupled to the error amplifier; first and second wave generators, generating first and second reference waves; a first comparator, responsive to the first reference wave and the input audio signal; a second comparator, responsive to the second reference wave and the input audio signal; a control logic unit, receiving outputs of the first and second comparators and further a clock signal or a reference voltage, the control logic unit resulting pulses in the differential outputs in response to the clock signal or the reference voltage and a cross relationship between the input audio signal and the first and second reference waves; a switching unit, the operation states of the switching unit being under control of the control logic unit, the switching unit outputting the differential outputs; and a feedback unit, feed backing the differential outputs to the error amplifier, the error amplifier correcting the differential outputs in response to the input audio signal. Pulses of one of the differential outputs are not overlapped with pulses of the other of the differential outputs for eliminating common mode noises of the power amplifier.

Further, in another embodiment of the invention, an audio signal processing method for driving a load impedance is provided. In the method, an input audio signal is input. Pulses in differential outputs are generated in response to a clock signal or a reference voltage and a cross relationship between the input audio signal and first and second reference waves. The differential outputs are feedback for correcting the differential outputs in response to the input audio signal.

The load impedance is driven by the differential outputs. Pulses of one of the differential outputs are not overlapped with pulses of the other of the differential outputs for eliminating common mode noises.

In still another embodiment of the invention, a filterless audio power amplifier for processing an input audio signal is provided. The filterless audio power amplifier outputs a pair of differential outputs for driving a load impedance. The filterless audio power amplifier includes: an input amplifier, pre-amplifying the input audio signal; an error amplifier, receiving an output of the input amplifier; first and second reference wave generators, generating first and second reference waves; a first comparator, including a first input terminal for receiving the first reference waves, a second input terminal for receiving an output of the error amplifier and an output terminal; a second comparator, including a first input terminal for receiving the second reference waves, a second input terminal for receiving an output of the error amplifier and an output terminal; a control logic unit, receiving outputs of the first and second comparators and further a clock signal or a reference voltage, the control logic unit resulting pulses in the pair of differential outputs in response to the clock signal or the reference voltage and a cross relationship between the input audio signal and the first and second reference waves; a gate driver, coupled to the control logic unit; a switching unit, driven by the gate driver, the operation states of the switching unit being under control of the control logic unit, the switching unit outputting the differential outputs; and a feedback unit, feed backing the differential outputs to the error amplifier, the error amplifier correcting the differential outputs in response to the input audio signal. State changes of one of the differential outputs are not simultaneous with state changes of the other of the differential outputs for eliminating common mode voltages of the power amplifier.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
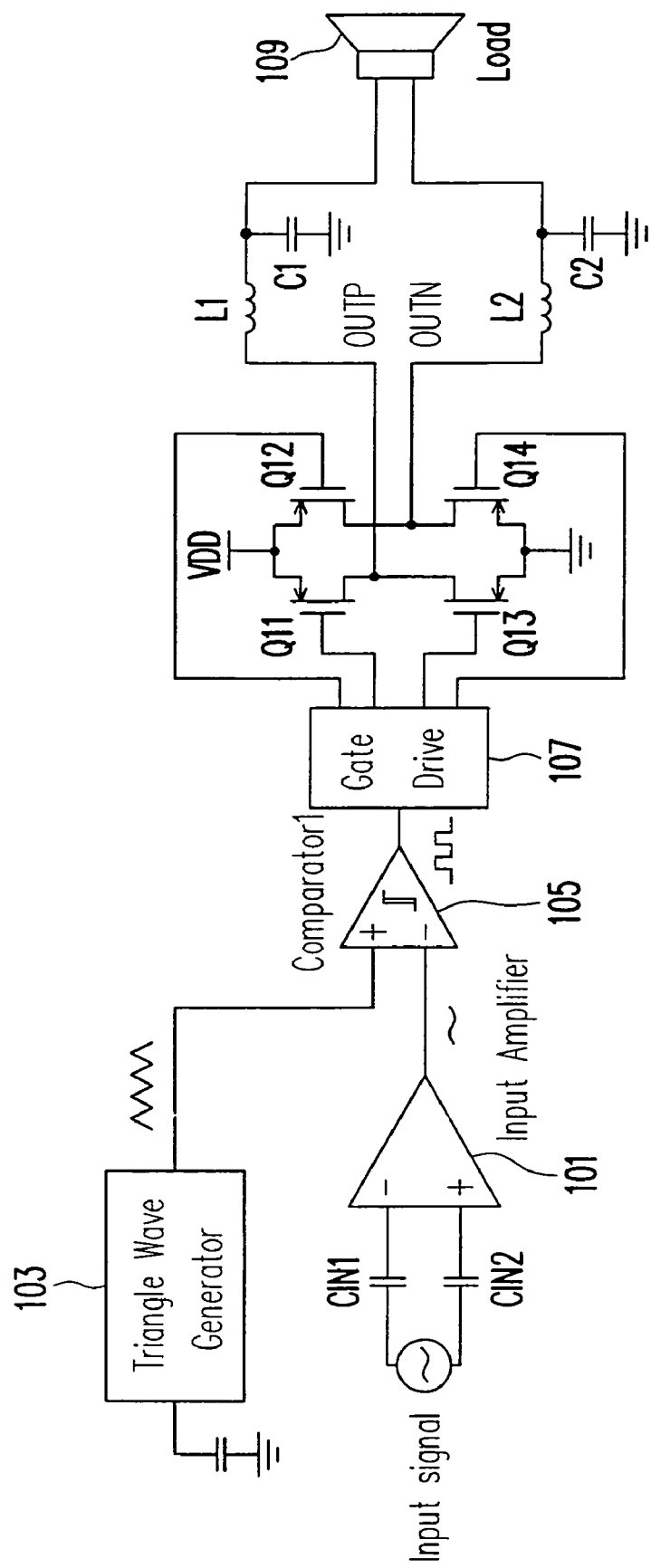
FIG. 1 illustrates a diagram of a Class D amplifier familiar in the known art.
Figure 2A:
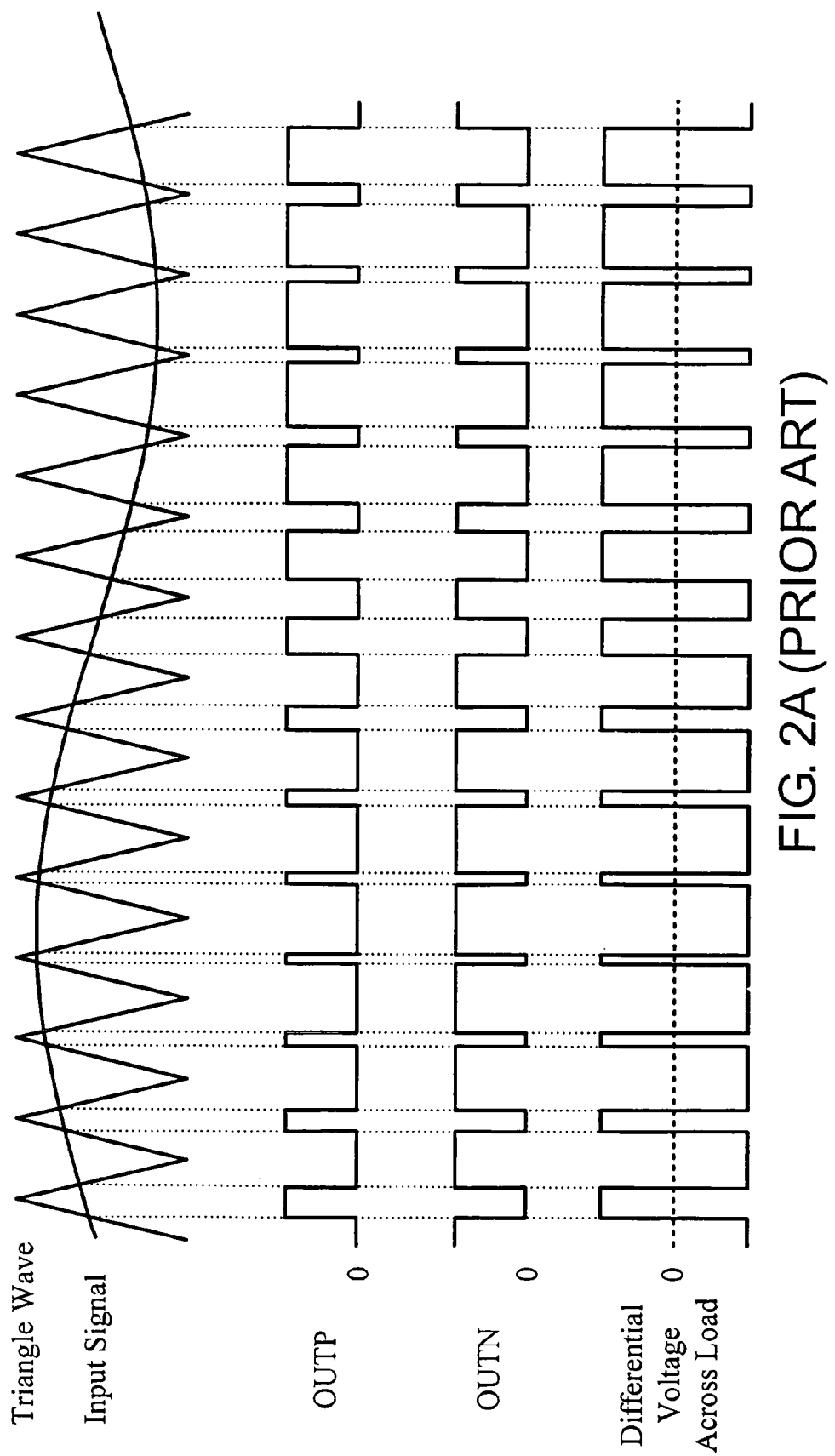
FIGS. 2A~2C illustrate waveforms of FIG. 1 when the input signal is large, small and zero, respectively.
Figure 2B:
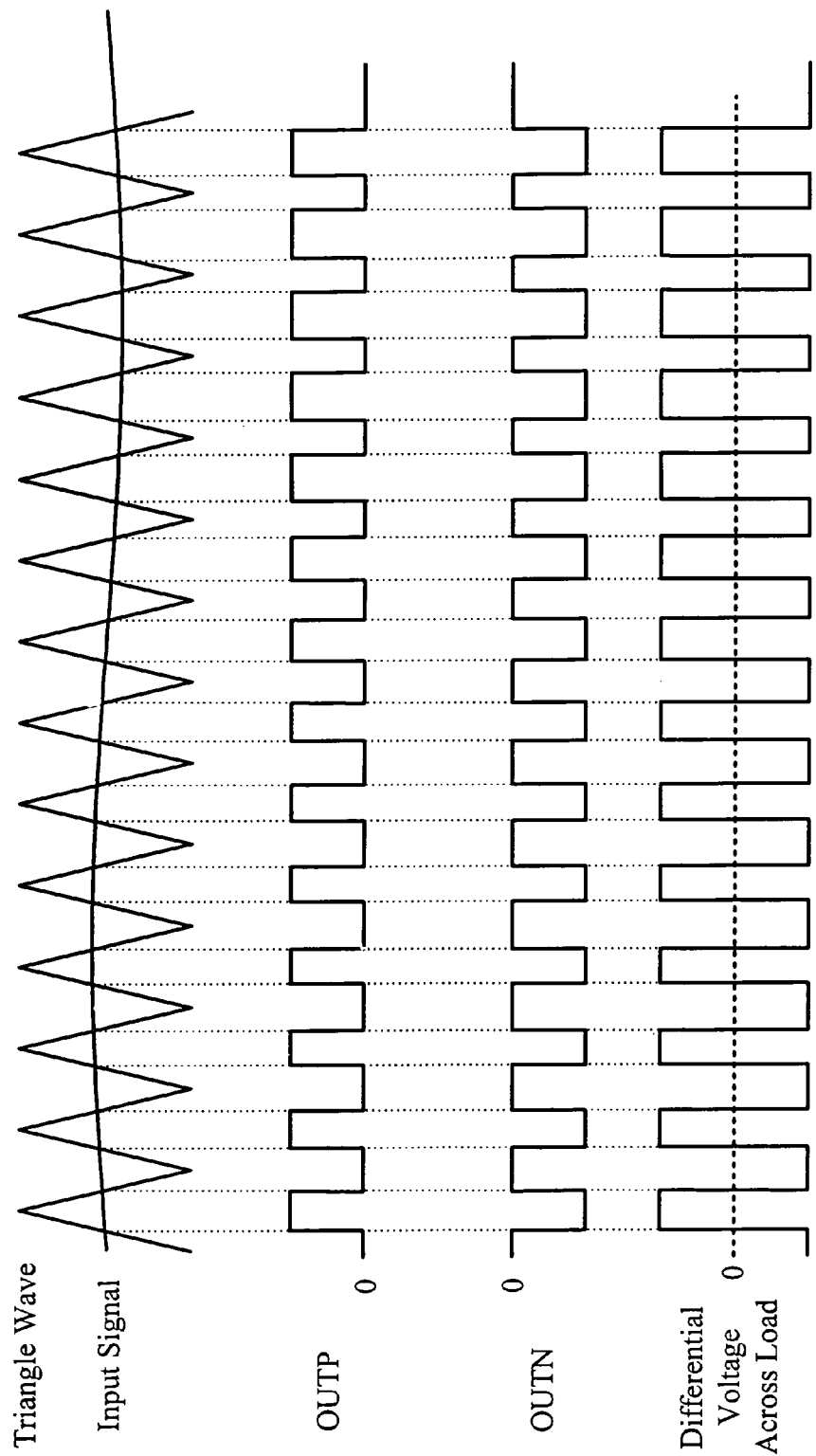
Figure 2C:
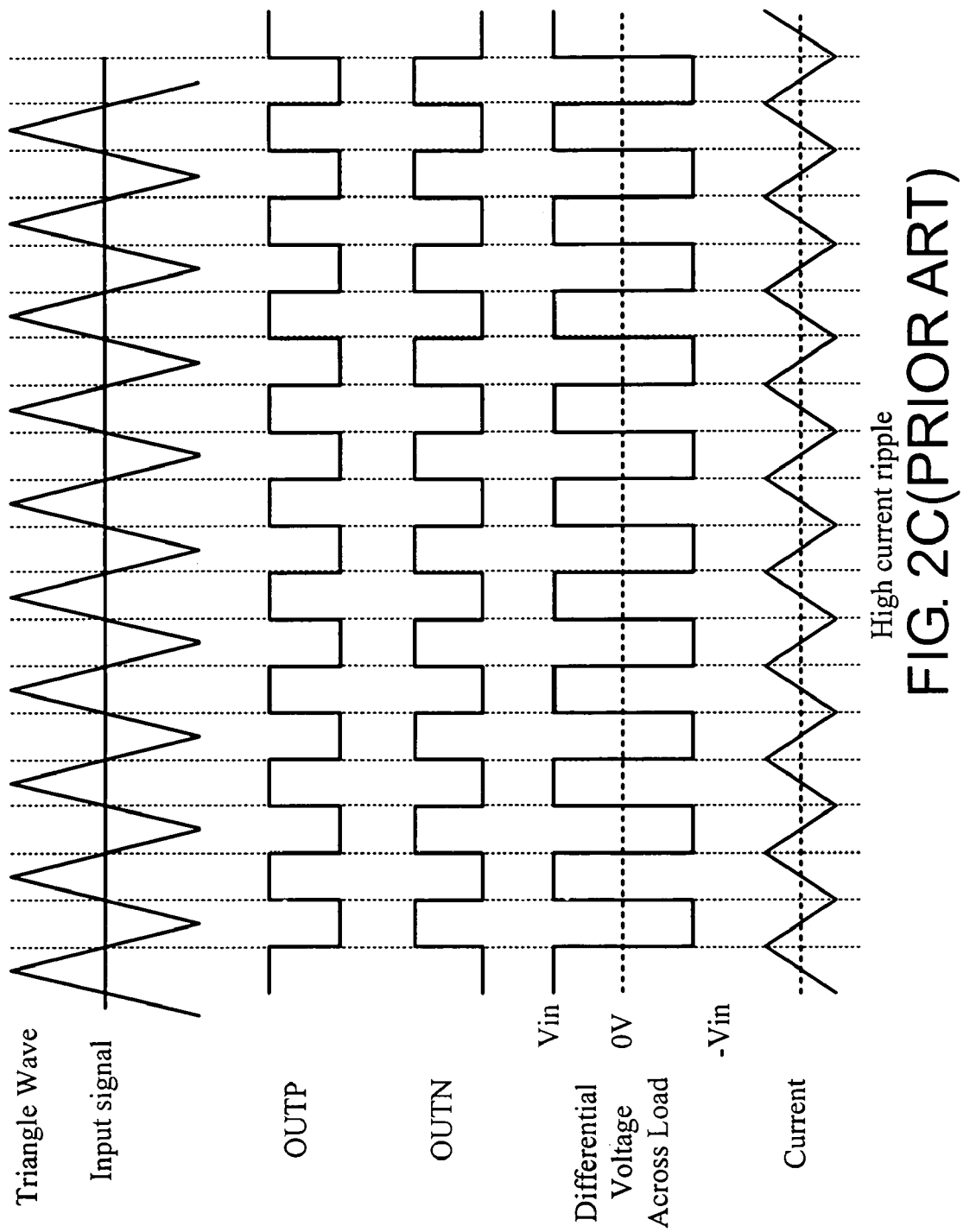
Figure 3:
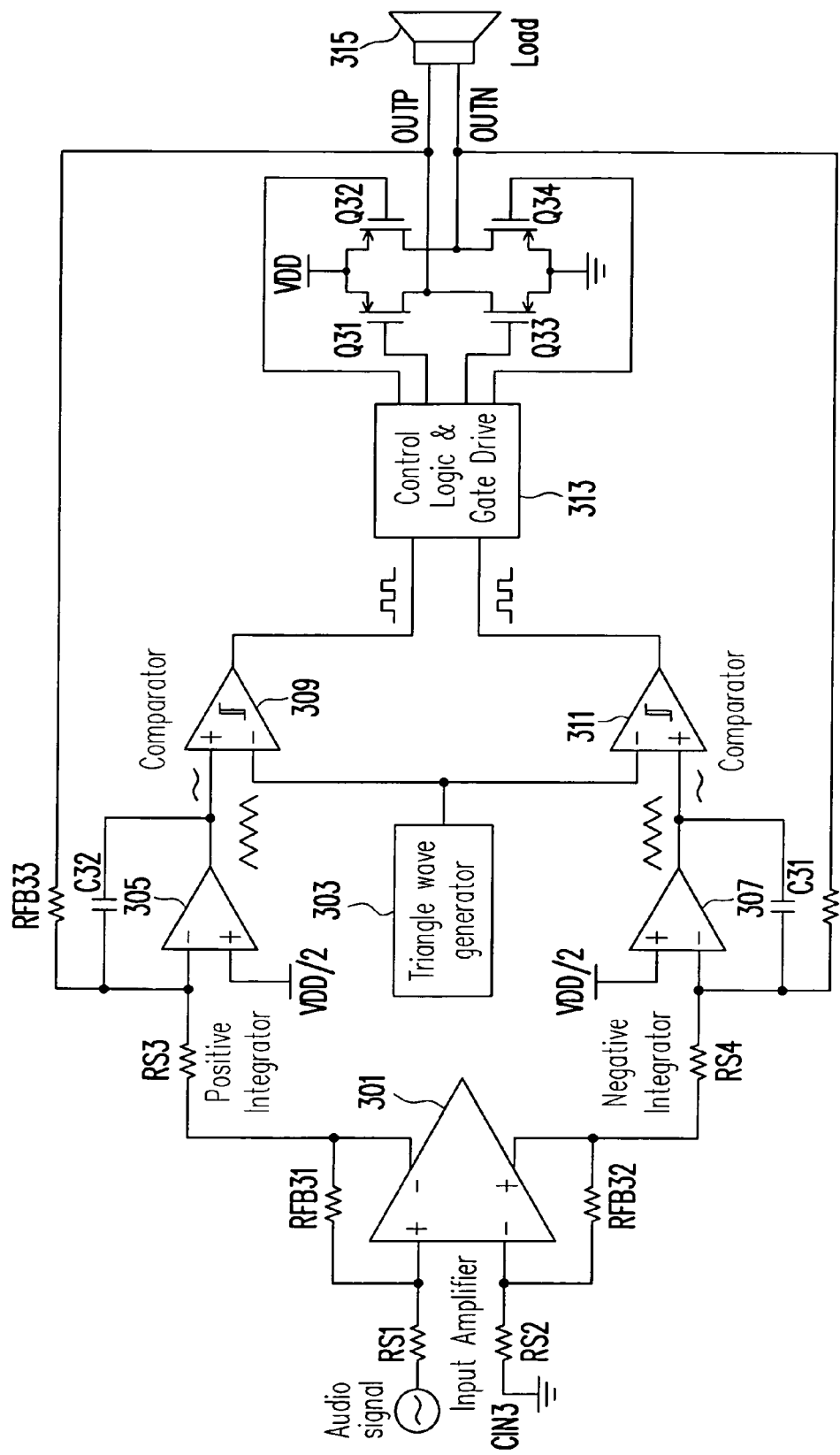
FIG. 3 illustrates a diagram of a traditional filterless class D amplifier.
Figure 4A:
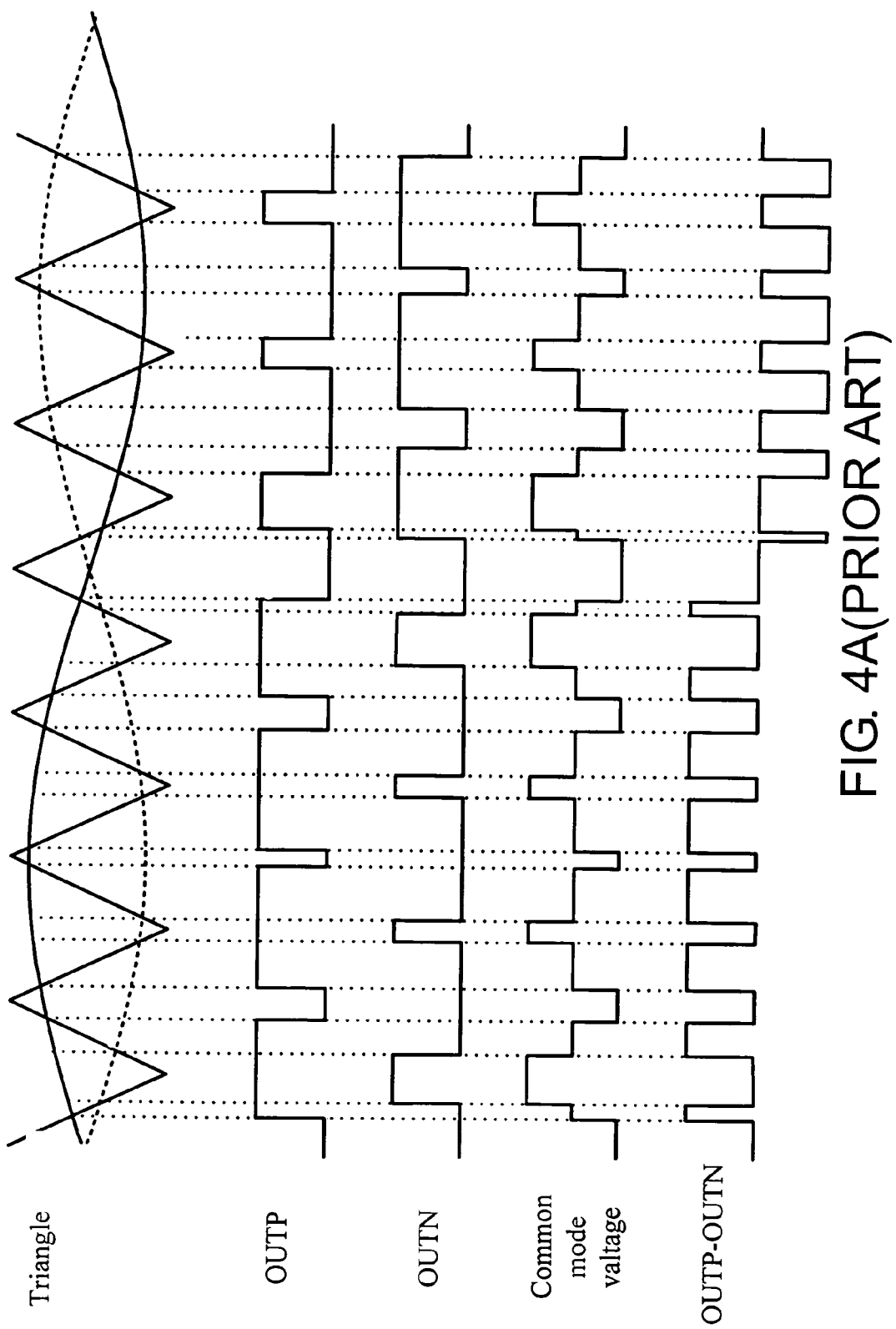
FIGS. 4A and 4B illustrate waveforms of FIG. 3 when the input signal is large and small, respectively.
Figure 4B:
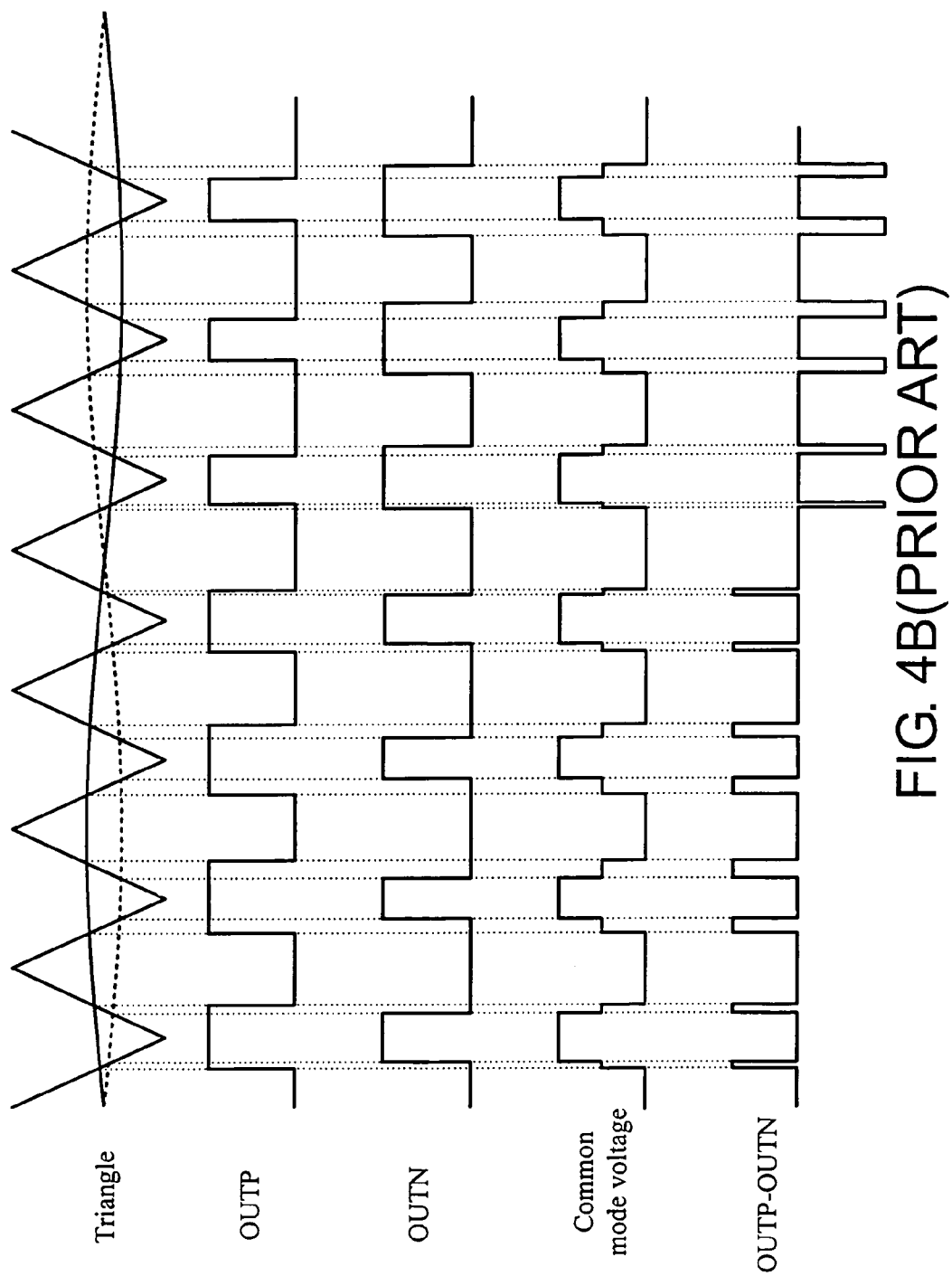

Reference will now be made in detail to the present embodiments of the invention, examples of which are illustrated in the accompanying drawings. Wherever possible, the same reference numbers are used in the drawings and the description to refer to the same or like parts.

One embodiment of the present invention provides a modulation scheme for filterless switching amplifiers with reduced EMI. The double triangular waves reduce the common mode voltage of the output signal via the two triangle waves and a control logic block added between the output of comparators and the switching unit.

Figure 5:
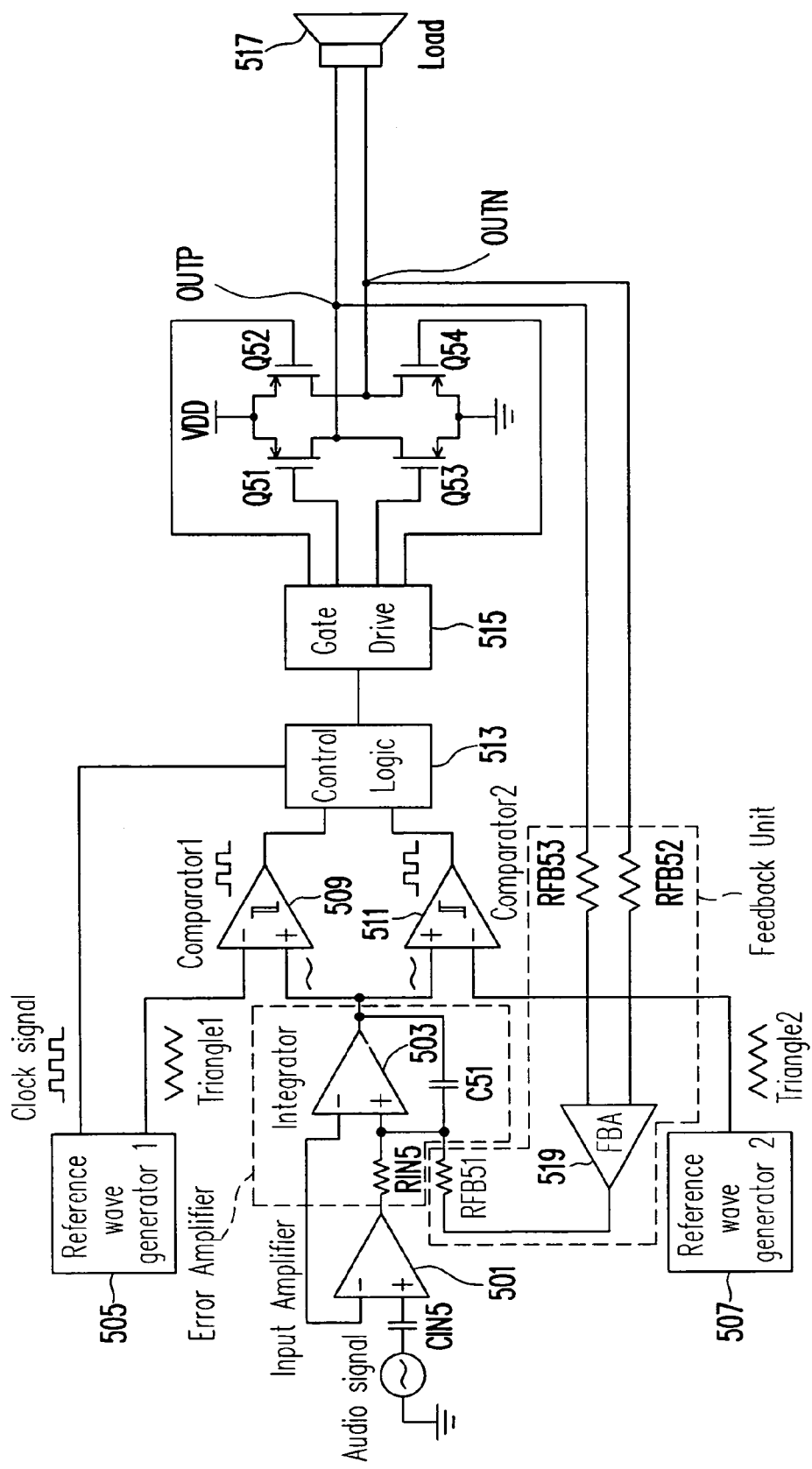
FIG. 5 illustrates a diagram of a filterless class D amplifier according to an embodiment of the present invention.

FIG. 5 illustrates a diagram of a filterless class D audio power amplifier for EMI reduction according to an embodiment of the present invention. An input audio signal is input into a negative input of an input amplifier 501 via a capacitor CIN5. Input amplifier 501 pre-amplifies the input audio signal. Input amplifier 501 further has a positive input coupled to a positive input of an integrator 503. The output of input amplifier 501 is coupled into a negative input of integrator 503 via a resistor RIN5. The output of integrator 503 is further fed-back into the negative input of integrator 503 via a capacitor C51. Integrator 503, resistor RIN5 and capacitor C51 forms an error amplifier for correcting differential output signals (OUTP and OUTN) of the class D audio amplifier in response to the (pre-amplified) input audio signal.

Two reference wave generators 505 and 507 generate reference waves respectively. For example, but not limited by, generators 505 and 507 respectively generate saw tooth (or triangular) reference waves Triangle 1 and Triangle 2. Reference waves Triangle 1 and Triangle 2 are symmetric and 180 degrees out of phase from each other. Waveforms of Triangle 1 and Triangle 2 are shown in FIG. 6. Of course, the phase relationship between the reference waves generated by the reference wave generators is not limited thereto. For example, the reference waves may be trailing edge ramp waves, leading edge ramp waves, or combination thereof. Reference wave Triangle 1 is coupled into a negative input of a comparator 509 and reference wave Triangle 2 is coupled into a negative input of a comparator 511. The output signal of integrator 503 (or said, the output signal of the error amplifier) is coupled into both positive inputs of comparators 509 and 511. As shown in FIG. 5, the output signal of integrator 503 (or said, the output signal of the error amplifier) is corresponding to or equivalent to the input audio signal.

As known, an output signal of a comparator goes high when the positive input is higher than the negative input. The output signal of comparator 509 goes high when reference wave Triangle 1 is lower than the output signal of integrator 503. Or equivalently, the output signal of comparator 509 goes high when reference wave Triangle 1 is lower that the input audio signal. Similarly, the output signal of comparator 511 goes high when the output signal of integrator 503 is higher than reference wave Triangle 2. Or equivalently, the output signal of comparator 511 goes high when the input audio signal is higher that reference wave Triangle 2.

Figure 6A:
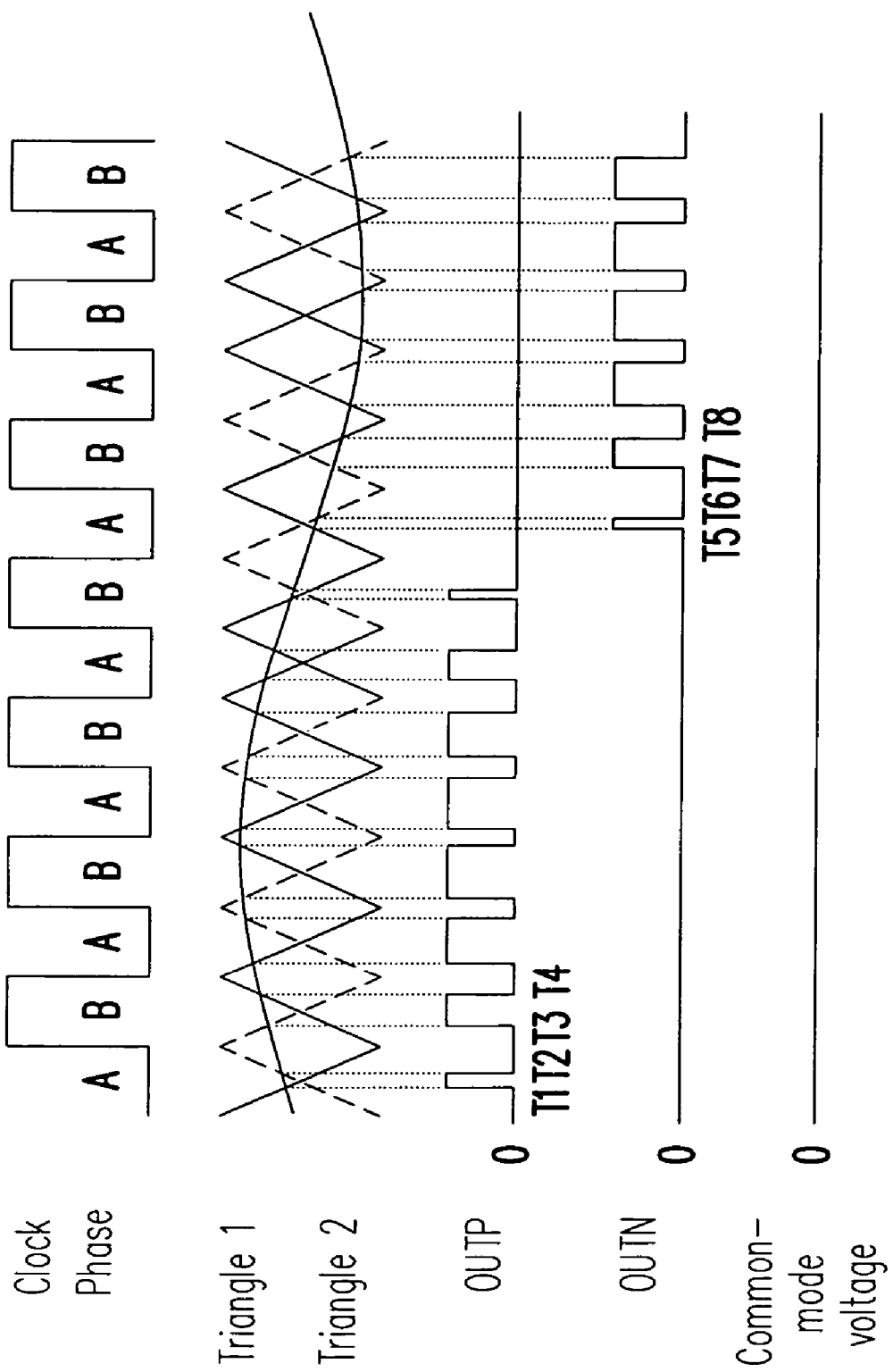
FIGS. 6A and 6B illustrate waveforms of FIG. 5.
Figure 6B:
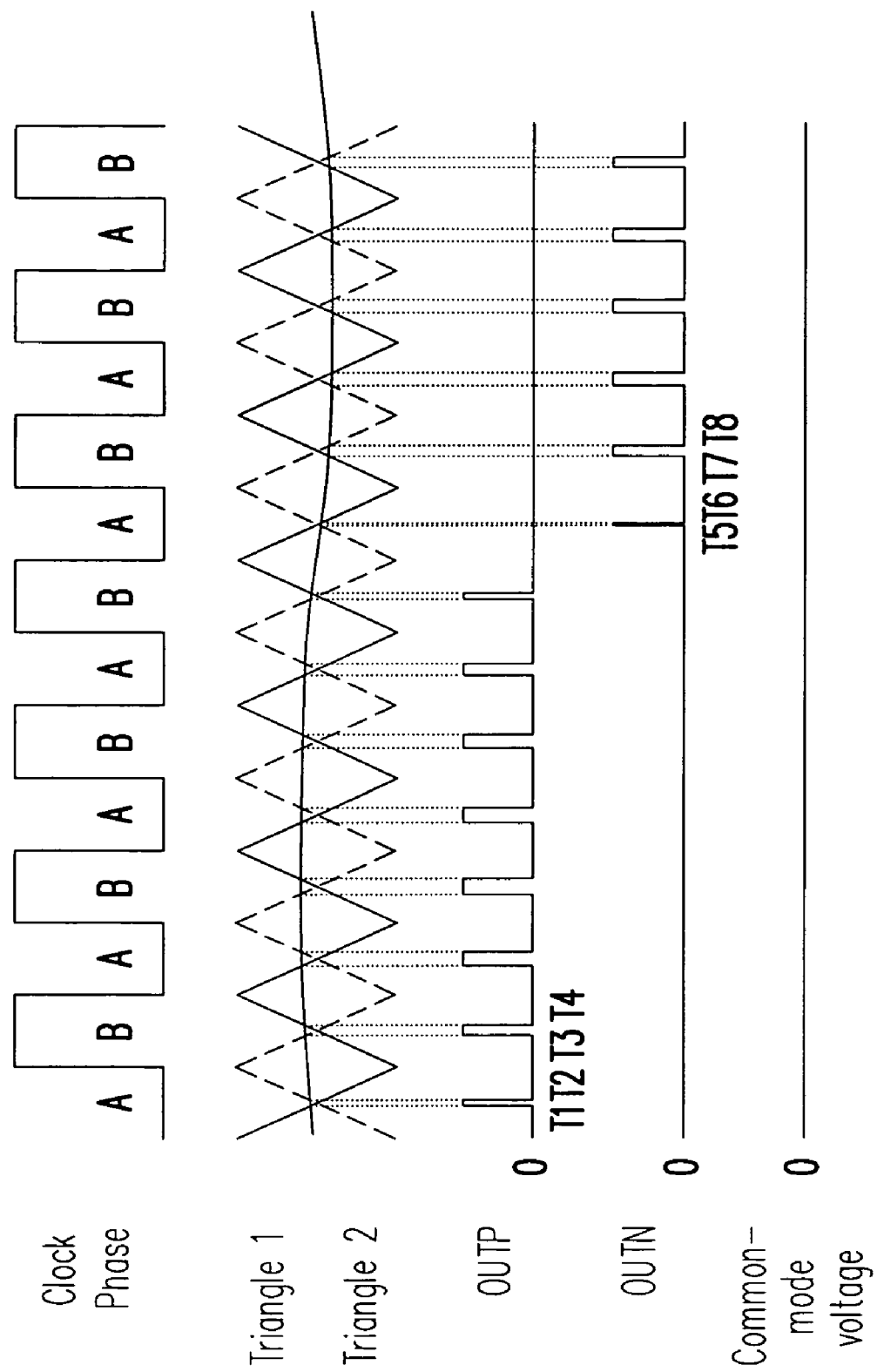

Output signals of comparators 509 and 511 are coupled to a control logic 513. Control logic 513 further receives a clock signal. The clock signal is generated by, for example but not limited to, reference wave generator 505. Of course, the clock signal may be provided by reference wave generator 507. Please refer to FIGS. 6A and 6B. The clock signal has two states: phases A and B which represent logic "L" and "H" respectively, as shown in FIGS. 6A and 6B. We can discriminate two cases when input signal is at phase A or B. When the clock signal is at phase A and the input signal first crosses Triangle 1 then Triangle 2, control logic 513 results a pulse at OUTP, for example a pulse from T1 to T2. When the clock signal is at phase A and the input signal first crosses Triangle 2 then Triangle 1, control logic 513 results a pulse at OUTN, for example a pulse from T5 to T6. When the clock signal is at phase B and the input signal first crosses Triangle 1 then Triangle 2, control logic 513 results a pulse at OUTP, for example a pulse from T3 to T4. When the clock signal is at phase B and the input signal first crosses Triangle 2 then Triangle 1, control logic 513 results a pulse at OUTN, for example a pulse from T7 to T8.

A gate drive 515 drives or switches switching transistors Q51~Q54 based on output signals of control logic 513. Configuration of gate drive 515 is not specifically limited here. Operation states of transistors Q51~Q54 are shown in FIGS. 7A~7D. Output signals OUTP and OUTN are obtained from terminals of transistors Q51~Q54. A pair of differential outputs OUTP and OUTN is used to drive a load 517. Load 517 is for example but not limited to, an audio speaker.

For more precisely driving load 517 in response to the input audio signal, output signals OUTP and OUTN are feedback to the error amplifier via feedback resistors RFB51~RFB53 and a feedback amplifier (FBA) 519. More specifically, output signal OUTP is coupled to FBA 519 via feedback resistor RFB53 and output signal OUTN is coupled to FBA 519 via feedback resistor RFB52. Output of FBA 519 is coupled to negative input of integrator 503 via feedback resistor RFB51. Feedback resistors RFB51~RFB53 and FBA 519 constitute a feedback unit.

Via the embodiment, the audio input signals are more precisely played out by the speaker in high quality and high efficiency.

FIGS. 6A and 6B illustrate waveforms of FIG. 5. For identification, Triangle 2 is in dot line. How to generate pulses in OUTP and OUTN is discussed above, so it is not repeated again. As shown in FIGS. 6A and 6B, only one output signal (either OUTP or OUTN) have state changes across the load. Which means pulses in OUTP will never be overlapped with pulses in OUTN, and vice versa. Because of this feature, common mode voltages (noises) in this embodiment are almost zero.

Figure 7A:
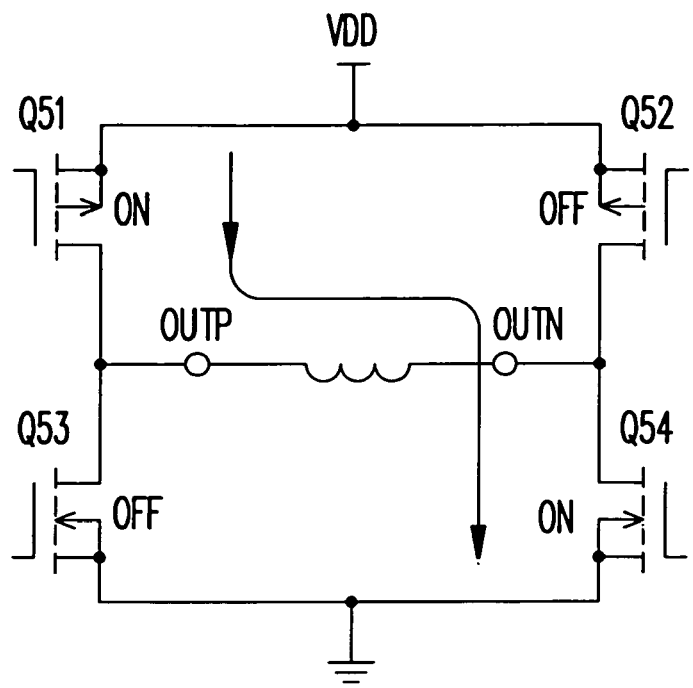
FIGS. 7A~7C illustrate operation states of switching transistors of FIG. 5.
Figure 7B:
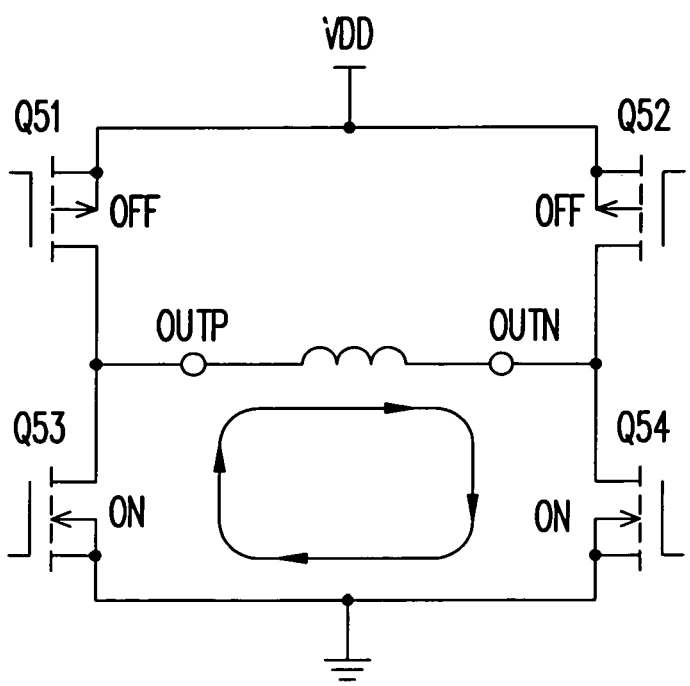
Figure 7C:
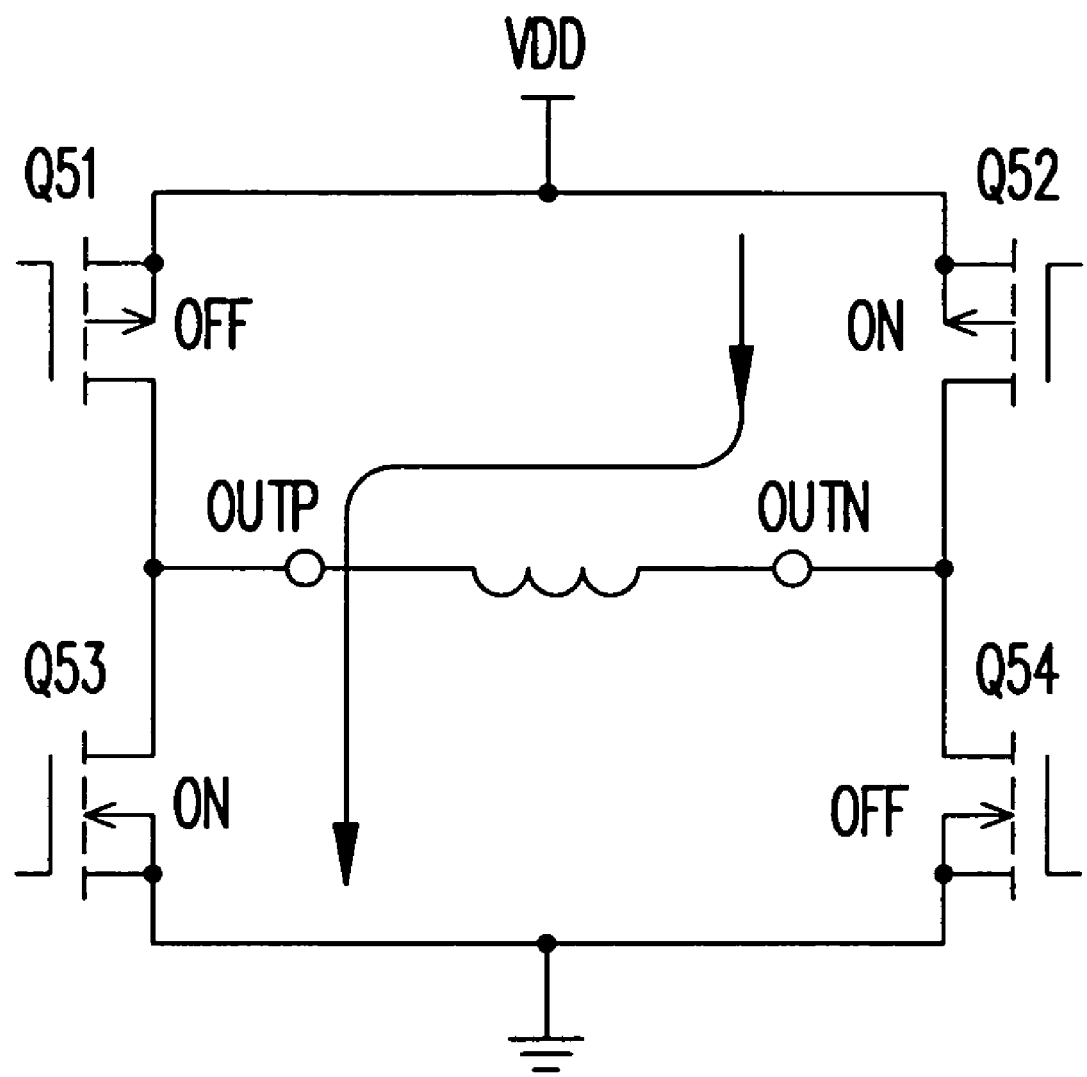

FIGS. 7A~7C illustrate operation states of switching transistors of FIG. 5. In these figures, signal flow is shown. More specifically, as shown in FIG. 5, transistors Q51~Q54 are controlled by gate driver 515. In FIG. 7A, transistors Q51 and Q54 are turned on and transistors Q52 and Q53 are off to make OUTP "H" and OUTN "L". In FIG. 7B, transistors Q51 and Q52 are turned off and transistors Q53 and Q54 are on to make both OUTP and OUTN "L". In FIG. 7C, transistors Q52 and Q53 are turned on and transistors Q51 and Q54 are off to make OUTP "L" and OUTN "H".

Figure 8A:
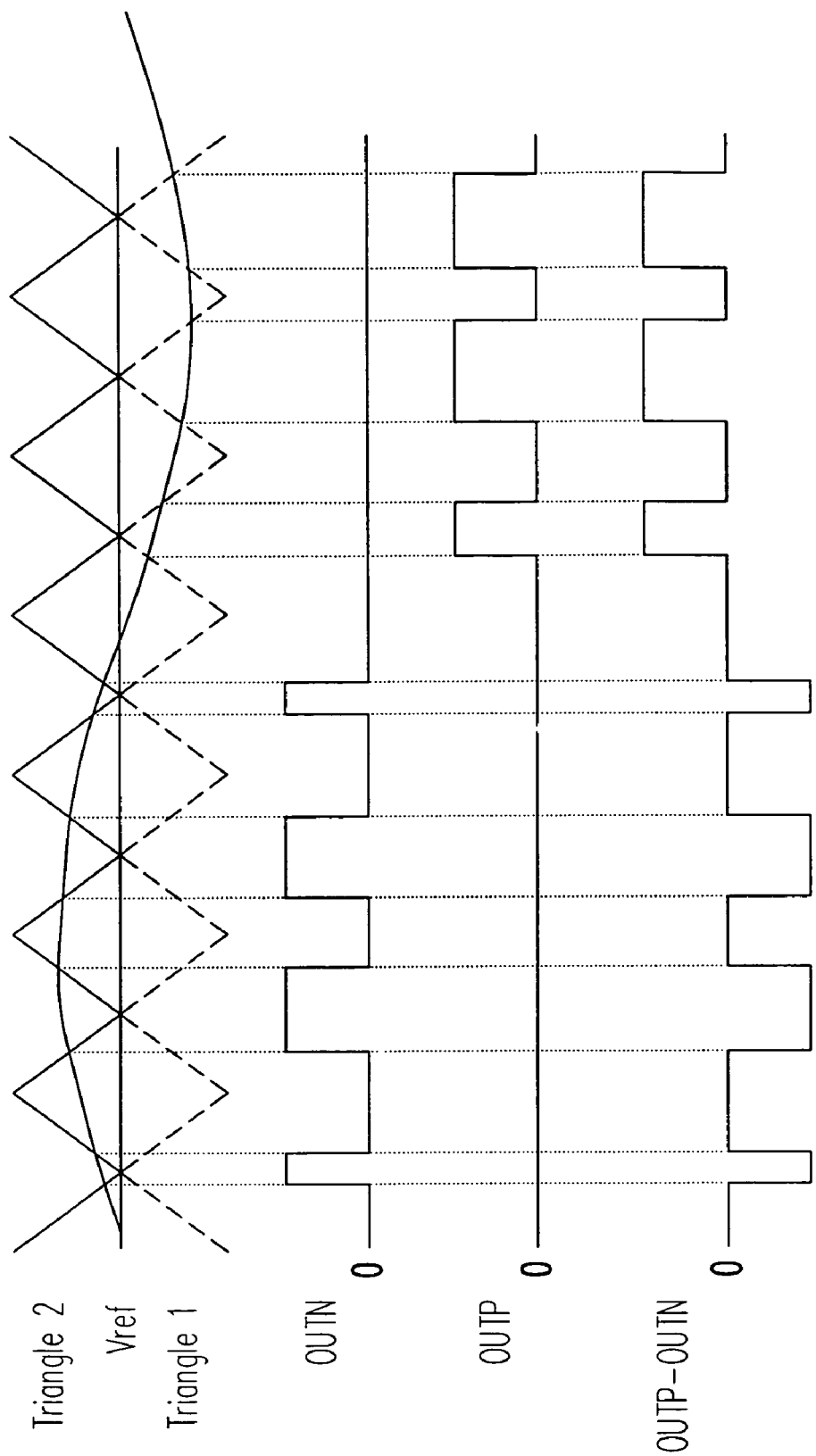
FIGS. 8A~8C illustrate other suitable waveforms applicable to the embodiment of the invention.
Figure 8B:
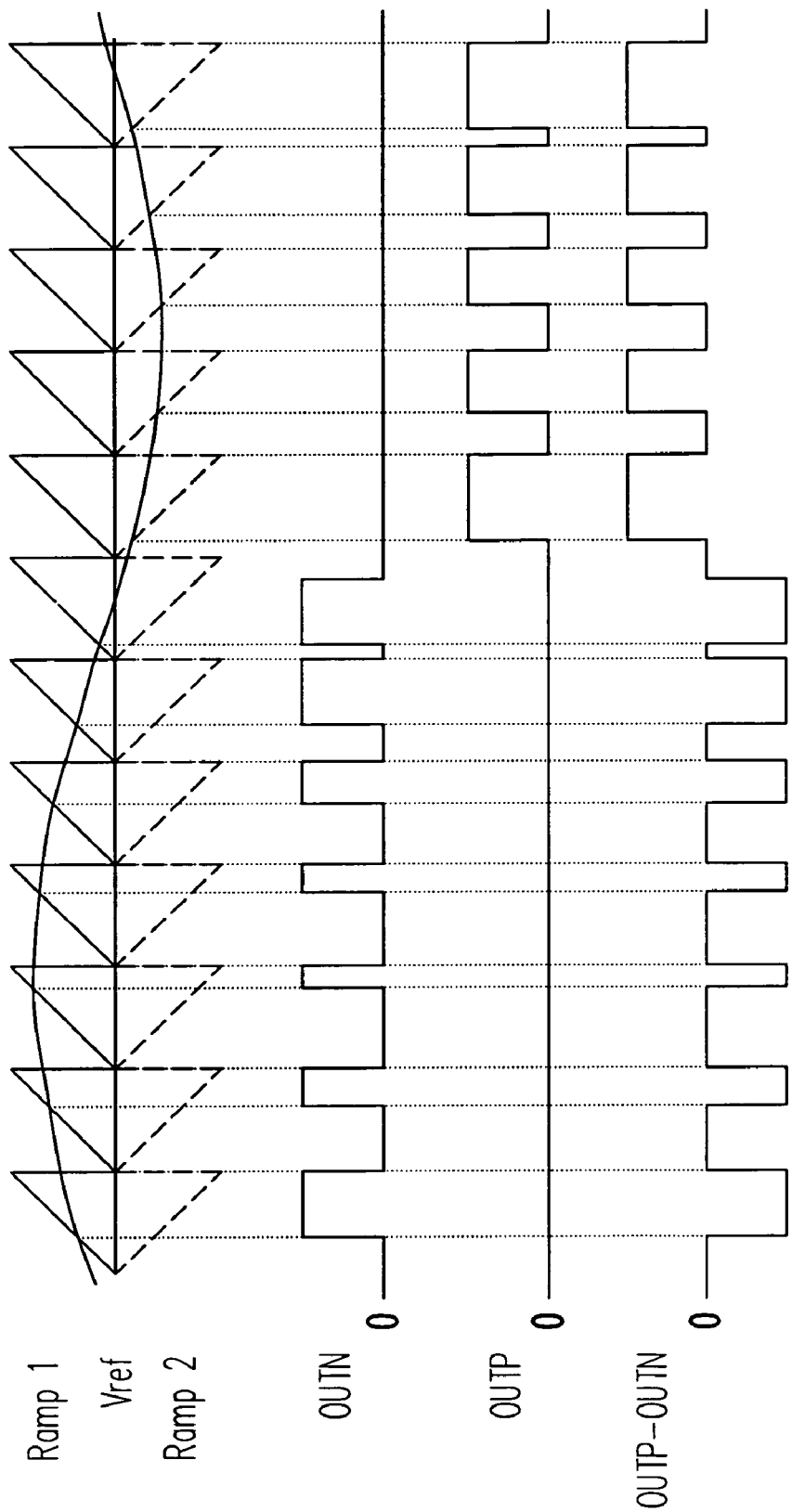
Figure 8C:
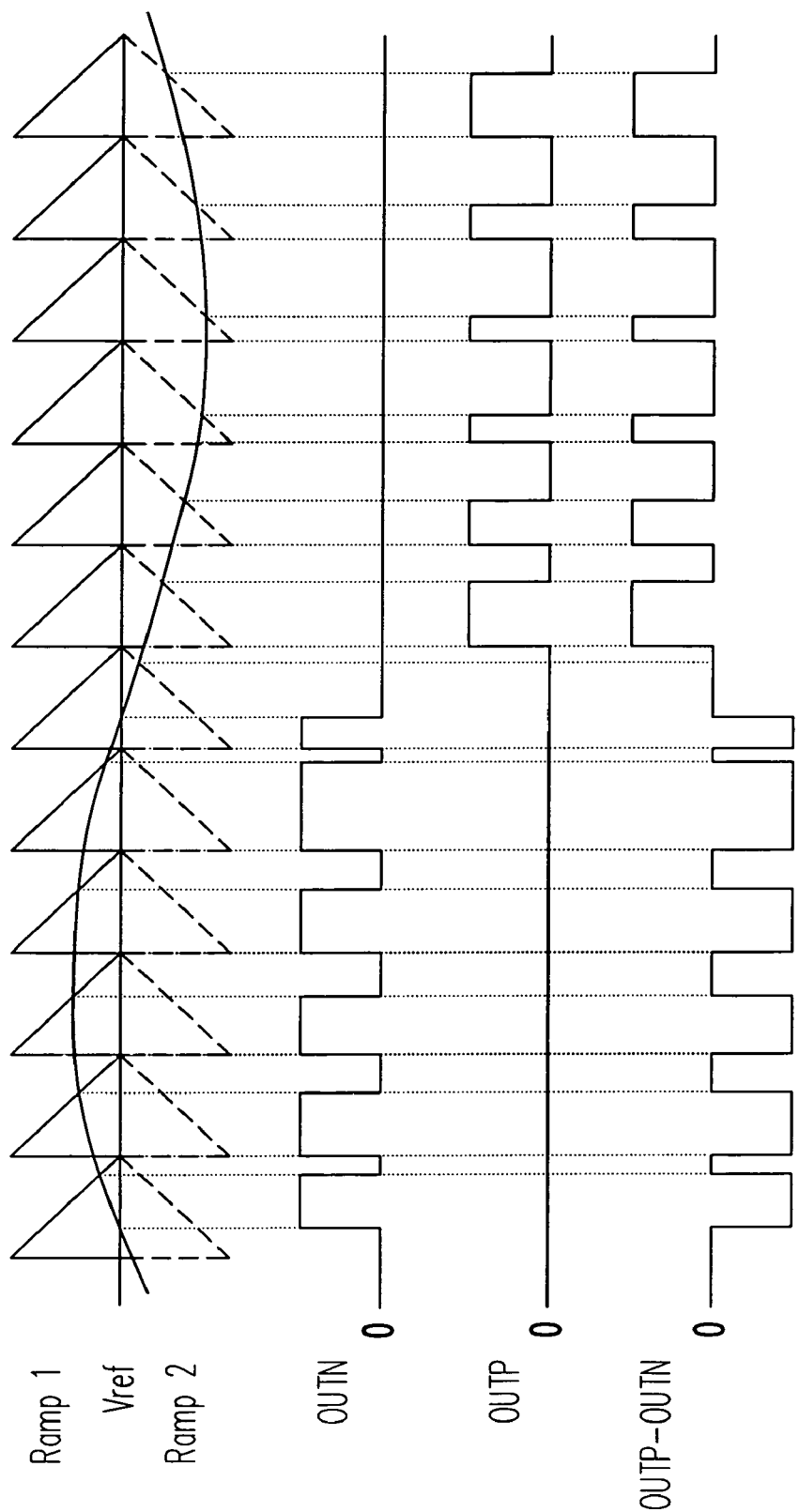

FIGS. 8A~8C illustrate other suitable waveforms applicable to the embodiment of the invention. In FIGS. 8A~8C, "Vref" refers to a reference voltage, for example not no limited by, 0V and is coupled to control logic 513. In FIG. 8A, waves Triangle 1 and Triangle 2 are symmetric to Vref. Triangle 1 is always lower than Vref and Triangle 2 is always higher than Vref. In FIGS. 8B and 8C, reference waves Ramp 1 and Ramp 2 are generated from generators 505 and 507 and they are also symmetric to Vref. In FIG. 8B, Ramp 1 and Ramp 2 are ramp waves with trailing edges. In FIG. 8C, Ramp 1 and Ramp 2 are ramp waves with leading edges. Similarly, state changes of output signals OUTP and OUTN are not occurred simultaneously and accordingly the common mode voltages are almost zero.

With this modulation scheme provided by the embodiment, state change of OUTP and OUTN will not occur simultaneously. Accordingly, the ripple currents are reduced and no common-mode switching noises occur since OUTP and OUTN never go high or low at the same time. The double triangle wave modulation scheme allows use of smaller and less expensive LC filters without increasing the quiescent currents. The double triangle wave modulation scheme can reduce power consumption when input signal is small. The double triangle wave modulation scheme not only keeps the advantages of ternary modulation scheme but also gains more power efficiency.

As used in the following description and claims, "integration" and "integrator" refers to the integration customarily found in the feedback loop of an audio feedback amplifier and not to the integration needed for phase or frequency compensation typically provided by inverters.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A filterless audio power amplifier for processing an input audio signal, the filterless audio power amplifier outputting a pair of differential outputs for driving a load impedance, comprising:
    an error amplifier, the input audio signal coupled to the error amplifier;
    first and second wave generators, generating first and second reference waves;
    a first comparator, coupled to the error amplifier, the first comparator being responsive to the first reference wave and the input audio signal;
    a second comparator, coupled to the error amplifier, the second comparator being responsive to the second reference wave and the input audio signal;
    a control logic unit, receiving outputs of the first and second comparators and further a third reference signal, the control logic unit resulting pulses in the pair of differential outputs in response to the third reference signal and a cross relationship between the input audio signal and the first and second reference waves, wherein pulses of one of the differential outputs are not overlapped with pulses of the other of the differential outputs for eliminating common mode noises of the power amplifier;
    a switching unit, coupled to the control logic unit, the operation states of the switching unit being under control of the control logic unit, the switching unit outputting the differential outputs; and
    a feedback unit, feed backing the differential outputs to the error amplifier, the error amplifier correcting the differential outputs in response to the input audio signal.

2. The filterless audio power amplifier of claim 1, further comprising an input amplifier having a negative input for receiving the input audio signal via a first capacitor, a positive input and an output for outputting the pre-amplified input audio signal to the error amplifier.

3. The filterless audio power amplifier of claim 2, wherein the error amplifier comprises:

an integrator, having a positive input for coupling to the positive input of the input amplifier, a negative input for receiving the output of the input amplifier via a first resistor, and an output terminal, wherein the output of the integrator is further feedback to the negative input of the integrator via a second capacitor.

4. The filterless audio power amplifier of claim 1, wherein the first comparator has a positive input for receiving the output of the error amplifier and a negative input for receiving the first reference wave; and the second comparator has a positive input for receiving the output of the error amplifier and a negative input for receiving the second reference wave.

5. The filterless audio power amplifier of claim 1, wherein the third reference signal is a clock signal having a first clock phase and a second clock phase; and when the input audio signal is at the first clock phase and the input audio signal first crosses the first reference wave then the second reference wave, the control logic unit results pulses at one of the differential outputs; when the input audio signal is at the first clock phase and the input audio signal first crosses the second reference wave then the first reference wave, the control logic unit results pulses at the other of the differential outputs; when the input audio signal is at the second clock phase and the input audio signal first crosses the first reference wave then the second reference wave, the control logic unit results pulses at the one of the differential outputs and when the input audio signal is at the second clock phase and the input audio signal first crosses the second reference wave then the first reference wave, the control logic unit results pulses at the other of the differential outputs.

6. The filterless audio power amplifier of claim 3, wherein the feedback unit includes:
   first, second and third feedback resistors; and
   a feedback amplifier for receiving the differential output via the second and third feedback resistors and generating an output to the negative input of the integrator via the first feedback resistor.

7. The filterless audio power amplifier of claim 1, wherein the first and second reference waves are triangular waves symmetric to each other and the third reference signal is a reference voltage.

8. The filterless audio power amplifier of claim 1, wherein the first and second reference waves are ramp waves having trailing edges and the third reference signal is a reference voltage.

9. The filterless audio power amplifier of claim 1, wherein the first and second reference waves are ramp waves having leading edges and the third reference signal is a reference voltage.

10. The filterless audio power amplifier of claim 1, wherein the load impedance is an audio speaker.

11. An audio signal processing method for driving a load impedance, the method comprising:
    introducing an input audio signal;
    generating pulses in differential outputs in response to a third reference signal and a cross relationship between the input audio signal and first and second reference waves, wherein pulses of one of the differential outputs are not overlapped with pulses of the other of the differential outputs for eliminating common mode noises;
    feedbacking the differential outputs for correcting the differential outputs in response to the input audio signal; and
    driving the load impedance by the differential outputs.

12. The method of claim 11, further comprising:
pre-amplifying the input audio signal.

13. The method of claim 11, wherein generating the pulses in the differential outputs includes:
    generating a clock signal as the third reference signal, the clock signal having first and second clock phases;
    when the input audio signal is at the first clock phase and the input audio signal first crosses the first reference wave then the second reference wave, resulting pulses at one of the differential outputs;
    when the input audio signal is at the first clock phase and the input audio signal first crosses the second reference wave then the first reference wave, resulting pulses at the other of the differential outputs;
    when the input audio signal is at the second clock phase and the input audio signal first crosses the first reference wave then the second reference wave, resulting pulses at the one of the differential outputs; and
    when the input audio signal is at the second clock phase and the input audio signal first crosses the second reference wave then the first reference wave, resulting pulses at the other of the differential outputs.

14. The method of claim 11, wherein the first and second reference waves are triangular waves symmetric to each other and the third reference signal is a reference voltage.

15. The method of claim 11, wherein the first and second reference waves are ramp waves having trailing edges and the third reference signal is a reference voltage.

16. The method of claim 11, wherein the first and second reference waves are ramp waves having leading edges and the third reference signal is a reference voltage.

17. A filterless audio power amplifier for processing an input audio signal, the filterless audio power amplifier outputting a pair of differential outputs for driving a load impedance, comprising:
    an input amplifier, pre-amplifying the input audio signal;
    an error amplifier, receiving an output of the input amplifier;
    first and second reference wave generators, generating first and second reference waves;
    a first comparator, including a first input terminal for receiving the first reference waves, a second input terminal for receiving an output of the error amplifier and an output terminal;
    a second comparator, including a first input terminal for receiving the second reference waves, a second input terminal for receiving the output of the error amplifier and an output terminal;
    a control logic unit, receiving outputs of the first and second comparators and further a third reference signal, the control logic unit resulting pulses in the pair of differential outputs in response to the third reference signal and a cross relationship between the input audio signal and the first and second reference waves, wherein state changes of one of the differential outputs are not simultaneous with state changes of the other of the differential outputs for eliminating common mode voltages of the power amplifier;
    a gate driver, coupled to the control logic unit;
    a switching unit, driven by the gate driver, the operation states of the switching unit being under control of the control logic unit, the switching unit outputting the differential outputs; and
    a feedback unit, feed backing the differential outputs to the error amplifier, the error amplifier correcting the differential outputs in response to the input audio signal.

18. The filterless audio power amplifier of claim 17, wherein the third reference signal is a clock signal having a first clock phase and a second clock phase; and when the input audio signal is at the first clock phase and the input audio signal first crosses the first reference wave then the second reference wave, the control logic unit results pulses at one of the differential outputs; when the input audio signal is at the first clock phase and the input audio signal first crosses the second reference wave then the first reference wave, the control logic unit results pulses at the other of the differential outputs; when the input audio signal is at the second clock phase and the input audio signal first crosses the first reference wave then the second reference wave, the control logic unit results pulses at the one of the differential outputs and when the input audio signal is at the second clock phase and the input audio signal first crosses the second reference wave then the first reference wave, the control logic unit results pulses at the other of the differential outputs.

19. The filterless audio power amplifier of claim 17, wherein the feedback unit includes:
  first, second and third feedback resistors; and
  a feedback amplifier for receiving the differential output via the second and third feedback resistors and generating an output to the error amplifier via the first feedback resistor.

20. The filterless audio power amplifier of claim 17, wherein the third reference signal is a reference voltage and the first and second reference waves are selected from a group of triangular waves symmetric to each other, ramp waves having trailing edges and ramp waves having leading edges.

* * * * *